United States Patent
Narayan et al.

(10) Patent No.: US 7,115,997 B2
(45) Date of Patent: Oct. 3, 2006

(54) SEEDLESS WIREBOND PAD PLATING

(75) Inventors: Chandrasekhar Narayan, Hopewell Junction, NY (US); Kevin Shawn Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 245 days.

(21) Appl. No.: 10/707,075

(22) Filed: Nov. 19, 2003

(65) Prior Publication Data
US 2005/0104217 A1    May 19, 2005

(51) Int. Cl.
*H01L 23/48*    (2006.01)
(52) U.S. Cl. .............. 257/769; 257/767; 257/768; 257/779; 257/620; 257/621; 257/730; 257/786
(58) Field of Classification Search ............. 257/769, 257/767, 768, 779, 620, 621, 730, 786
See application file for complete search history.

(56) References Cited

U.S. PATENT DOCUMENTS

| 4,956,602 | A | 9/1990 | Parrish |
| 5,313,158 | A | 5/1994 | Joosten et al. |
| 5,670,428 | A | 9/1997 | Beilstein, Jr. et al. |
| 5,804,464 | A | 9/1998 | Beilstein, Jr. et al. |
| 6,368,484 | B1 | 4/2002 | Valant et al. |
| 6,448,171 | B1* | 9/2002 | Wang et al. ............ 438/614 |
| 6,534,863 | B1 | 3/2003 | Walker et al. |
| 6,566,736 | B1* | 5/2003 | Ogawa et al. ........... 257/620 |
| 6,960,828 | B1* | 11/2005 | Nair et al. ............. 257/734 |
| 2004/0099877 | A1* | 5/2004 | Towle et al. ............ 257/127 |

OTHER PUBLICATIONS

IBM Technical Disclosure Bulletin, vol. 23, No. 8 Jan. 1981, "Kerf testing Of Embedded Structure Technologies" by C. J. Kugler, Jr. and G. E. Rudgers pp. 3716-3719.

* cited by examiner

*Primary Examiner*—Eddie C. Lee
*Assistant Examiner*—Junghwa Im
(74) *Attorney, Agent, or Firm*—Law Office of Charles W. Peterson, Jr.; Ira D. Blecker, Esq.

(57) ABSTRACT

An integrated circuit (IC) chip, semiconductor wafer with IC chips in a number of die locations and a method of making the IC chips on the wafer. The IC chips have plated chip interconnect pads. Each plated pad includes a noble metal plated layer electroplated to a platable metal layer. The platable metal layer may be copper and the noble metal plated layer may be of gold, platinum, palladium, rhodium, ruthenium, osmium, iridium or indium.

21 Claims, 4 Drawing Sheets

SEEDLESS WIREBOND PAD PLATING

BACKGROUND OF INVENTION

1. Field of the Invention

The present invention is related to semiconductor device manufacturing and more particularly to forming off chip connection pads for semiconductor integrated circuit (IC) chips.

2. Background Description

Typical semiconductor integrated circuit (IC) chips are multilayered units well known in the art with layers stacked such that layer features overlay one another to form individual devices and connect devices together. Individual layers normally are patterned lithographically using well known photolithographic techniques as applied to semiconductor manufacturing. State of the art chips have a surface layer populated by chip connection pads for input/output (I/O) and power connections, e.g., by wire bonding to the pads or with solder balls formed on the pads, e.g., for ball grid array (BGA) joining. Typically, the pads are of a self passivating material such as aluminum for wire bonding, which has an acceptable yield and, a relatively low fallout from pad failures and pad connection failures. Further, self passivating aluminum and connections to it can withstand the normal stresses encountered in chip use.

However, while aluminum may be self passivating and provide relatively reliable connections, aluminum is not amenable for plating and so, not an ideal choice for low cost IC wiring or for chip connections. Ideally, instead of aluminum, the I/O and power pads would be of a noble metal, e.g., gold or platinum, for high quality low resistance pads. Unfortunately, forming such noble metal pads has been difficult and has proven too costly to be implemented for widespread use. U.S. Pat. No. 6,368,484 B1 entitled "Selective Plating Process" to Volant et al. and U.S. Pat. No. 6,534,863 B2 entitled "Common Ball-Limiting Metallurgy for I/O Sites" to Walker et al., both assigned to the assignee of the present invention and incorporated herein by reference teach methods of forming electroplated pads on a semiconductor wafer. Both Volant et al. and Walker et al. teach forming a liner layer on the semiconductor wafer and selectively forming a seed layer at pad locations. Unfortunately, the seed layer may form in (undesired) locations other than at pad layers. Further, the liner and seed layers must be cleanly removed once the pads are formed without damaging underlying structures. So, while chip pads can be formed as taught by both Volant et al. and Walker et al., the result is a comparatively low chip yield, e.g., due to contamination introduced in pad formation, which further increases chip cost to a prohibitive level.

Thus, there is a need for low cost, low resistance, high yield and very reliable off-chip connections or pads and especially, for off-chip pads formed of a noble metal that can be electrolytically plated.

SUMMARY OF INVENTION

It is a purpose of the invention to improve off-chip interconnects;

It is another purpose of the invention to improve off-chip pad resistance and current capacity;

It is yet another purpose of the invention to provide low cost noble metal off-chip interconnects.

The present invention relates to an integrated circuit (IC) chip, semiconductor wafer with IC chips in a number of die locations and a method of making the IC chips on the wafer. The IC chips have plated chip interconnect pads.

Each plated pad includes a noble metal plated layer on a barrier metal layer. The barrier metal layer may be tantalum nitride on tantalum and the noble metal plated layer may be gold or platinum.

BRIEF DESCRIPTION OF DRAWINGS

The foregoing and other objects, aspects and advantages will be better understood from the following detailed description of a preferred embodiment of the invention with reference to the drawings, in which.

DETAILED DESCRIPTION

Figure 1:
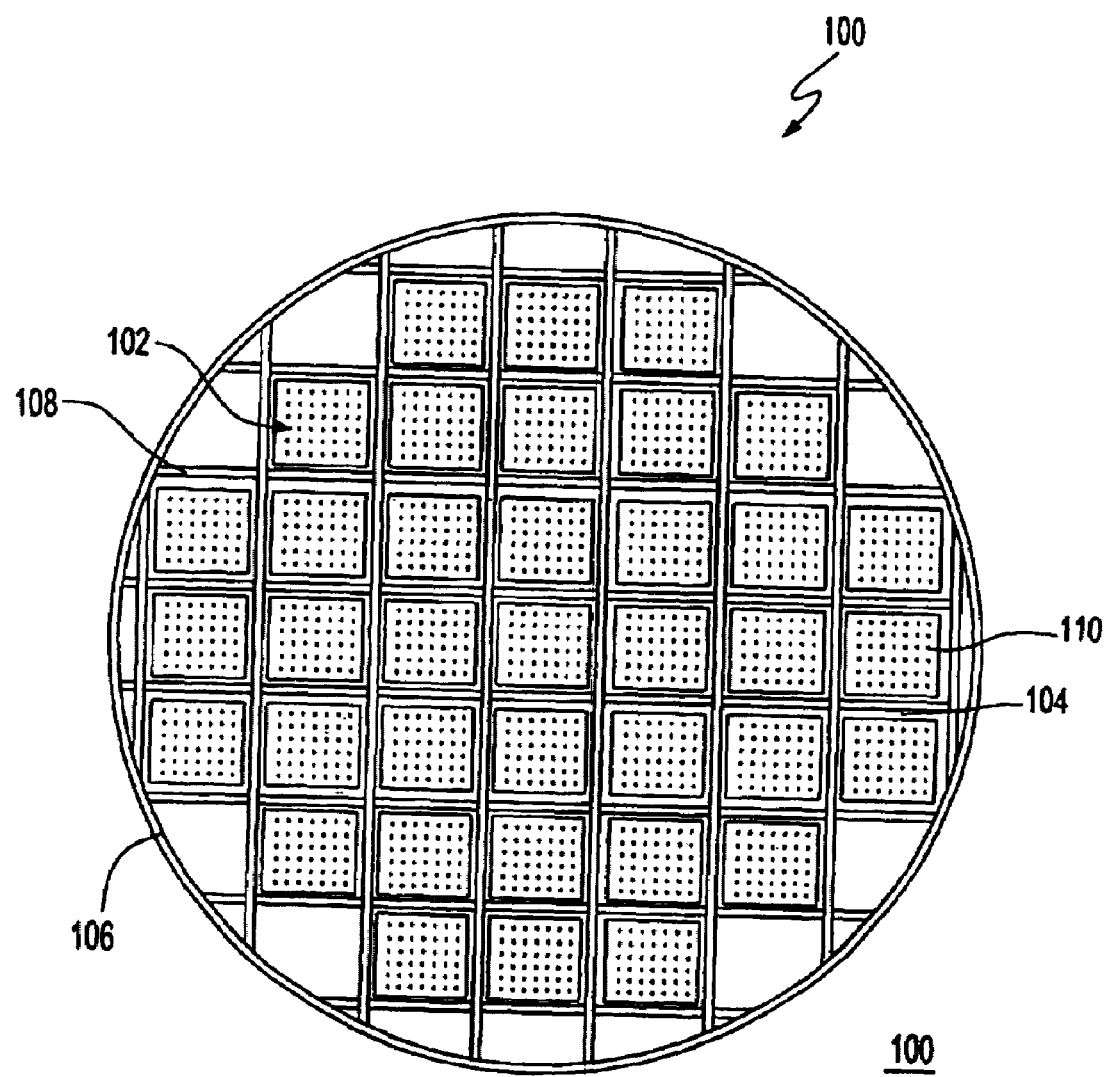
FIG. 1 shows the plan view of a semiconductor wafer with individual integrated circuit (IC) chips formed thereon with plated terminal metal according to a preferred embodiment of the present invention.

Turning now to the drawings and, more particularly, FIG. 1 shows the plan view of a semiconductor wafer 100 with individual integrated circuit (IC) chips formed thereon in die locations 102 and with terminal metal electrolytically plated or electroplated according to a preferred embodiment of the present invention. For simplicity of description and for example only, the chips 102 are treated as identical copies of the same chip, e.g., a microprocessor, although each die 102 may be a unique copy of an individual IC chip. A kerf or cutting space 104 separates the die 102. Normally, the kerf space 104 is wasted wafer area though which a cutting instrument, e.g., a saw blade, passes to separate the die into individual chips and is wide enough that the cutting instrument can separate the die into individual chips without damage to the chips. A conductive ring 106, which provides a superior electrical contact for plating equipment, encircles the wafer 100 and, in this example, connects to both ends of grid lines 108 in the kerf 104 to form a conductive grid over the wafer 100.

The conductive ring 106 and grid lines 108 may be one or more layers of any suitable non-platable conductive material or a combination of such conductive materials as are well known in the art. In particular, suitable conductive material may include, for example, nickel (Ni), tantalum (Ta), tantalum nitride (TaN), titanium (Ti), titanium nitride (TiN), aluminum (Al), tungsten (W), chromium (Cr), titanium tungsten (TiW) and combinations thereof. A typical state of the art insulating or passivation layer, e.g., nitride, covers the wafer, leaving exposed only the conductive ring 106 and input/output (I/O) and power pads, typically in an array on each die. The grid lines 108 are electrically connected to the pads in each of the die 102 for biasing the pads during electroplating according to a preferred embodiment of the present invention as described herein below. This opening to the conductive ring 106 can be formed during an etch (pad opening etch) that opens the insulator to the pad terminals. Alternatively, the grid lines 108 may be covered with a spin-on insulator (i.e. polyimide or a photo sensitive type spin-on insulator) and the ring patterned, developed and opened with solvents during a photolithography step.

Figure 2A:
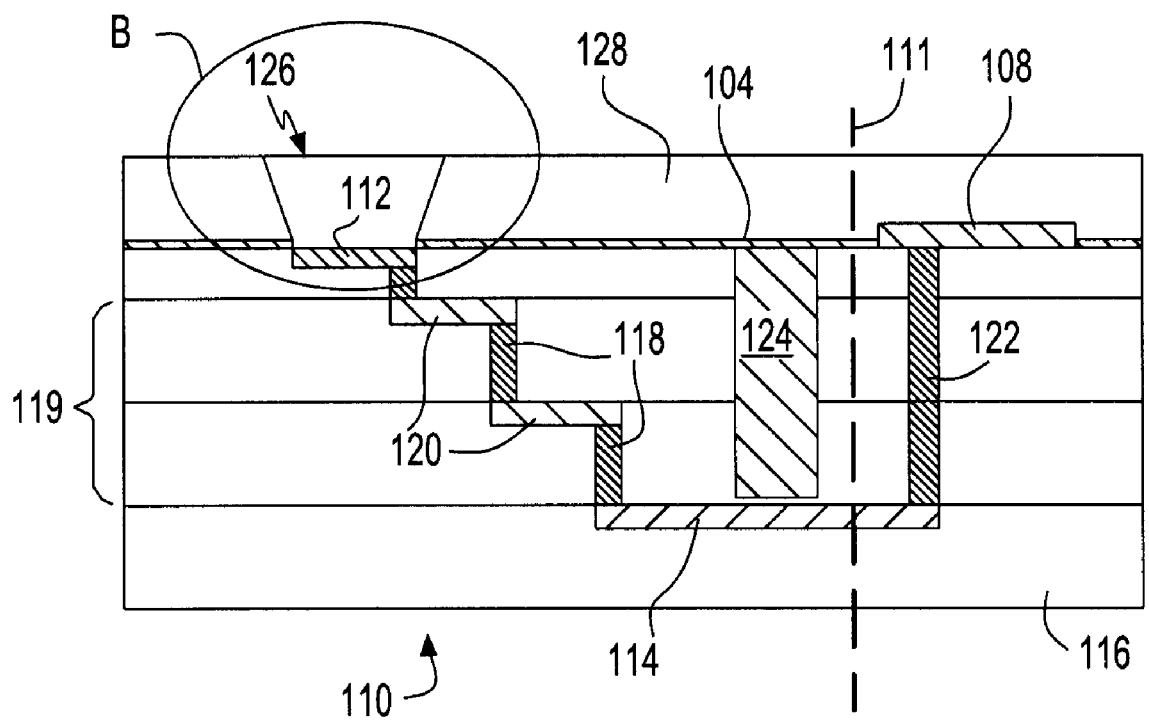
FIG. 2A shows a cross sectional example of a chip through an electroplatable pad, preferably a copper pad.

FIG. 2A shows a cross sectional example of a chip (e.g., in die 110 in FIG. 1) through an electroplatable pad 112, preferably copper/nickel. In this example, the electroplatable pad 112 is at the periphery 111 of the die 110, i.e., adjacent to the kerf 104. Also, the die 110 is in a periphery die location and so, nothing is shown connected to the opposite side of grid line 108. Each electroplatable pad 112 includes a temporary strap 114 (preferably, a tungsten strap) in a lower wiring layer in this example. So, for this example, the temporary straps 114 may be formed at the semiconductor device surface, i.e., after front end of the line (FEOL) processing on a typical semiconductor wafer such as, on the silicon surface layer 116 of a silicon on insulator (SOI) wafer. Vertical interlevel wiring vias 118 through insulating material layers 119 connect chip wiring 120 at multiple wiring layers to electrically connect each electroplatable pad 112 to its corresponding temporary strap 114. Preferably, the wiring 120 and interlevel wiring vias 118 connecting the electroplatable pads 112 to the temporary straps 114 are copper. Stacked vias or studs 122, which may also be copper, electrically connect the temporary straps 114 to a grid line 108. Thus, an electrical path is formed from the grid lines 108 through the studs 122 to the temporary straps 114, from the temporary straps 114 through chip wiring 120 and interlevel vias 118 to the elecrtroplatable pads 112.

An inboard crack stop ring 124 along the die/kerf boundary defines the die and prevents chip cracking when the wafer is diced to separate the chips from one another. Since the crack stop ring 124 remains with and remains part of the particular diced chip, it cannot be part of the pad to grid conductive path and thus, the underlying temporary straps are necessary. Further, other than the temporary straps 114, no chip wiring passes beyond the crack stop ring 124 with the straps 114 providing an electrical path from the electroplatable pads 112 to respective grid lines 108. Cavities 126 are formed through the passivation layer 128 expose the electroplatable pads 112 for subsequent electroplating. The conductive ring 106, the upper surface of which is also exposed, combines with the grid (of grid lines 108) to complete an electrical connection to all electroplatable pads 112 forming a single electrode such that with a bias applied to the conductive ring 106, plating nucleates on the copper electroplatable pads 112 to form the final chip pads. An insulating layer (not shown) on the temporary straps 114 isolates the crack stop ring 124, electrically, from the straps 114. This insulating layer may be formed after a trench is opened for the crack stop ring 124 and before the trench is filled with material to form the crack stop ring 124. A normal kerf etch would remove any such insulating material on the straps 114 at stacked vias 122 assuring a good electrical contact from the straps 114 to stacked vias 122.

Figure 2B:
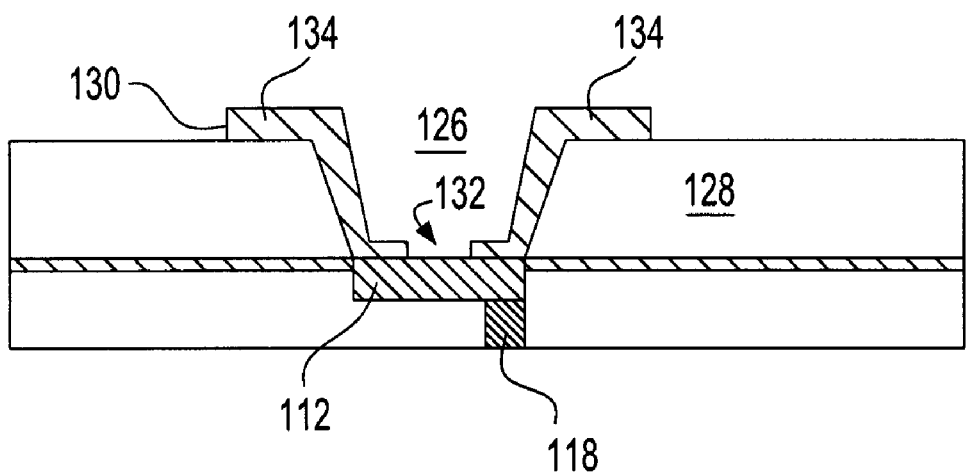
FIG. 2B shows a cross-sectional example of another preferred embodiment in area B of FIG. 2A.

FIG. 2B shows a cross-sectional example of another preferred embodiment in area B of FIG. 2A with all other features being substantially the same. In this embodiment, a barrier layer 130 of any suitable non-platable metal is deposited on the wafer 100. Barrier layer 130 may be the same material as the grid lines, such as for example, Ni, Ta, TaN, Cu, Ti, TiW, Cr, W or any combinations thereof and, preferably, is tantalum nitride on tantalum (Ta/TaN). The barrier layer is patterned to open an orifice 132 at each electroplatable pad 112 and, essentially, form a donut shaped barrier ring 134 at each of the electroplatable pads 112. Donut shaped barrier rings 134 act as a liner or adhesion layer for the plating to nucleate at the particular electroplatable pad 112. So, for this embodiment the electroplatable pads 112 serve a dual purpose acting as both the last copper wire level and to initiate metal nucleation during plating, which both Volant et al. and Walker et al. needed a separate seed layer deposited on the exposed portion of the electroplatable pad to accomplish.

Figure 3A:
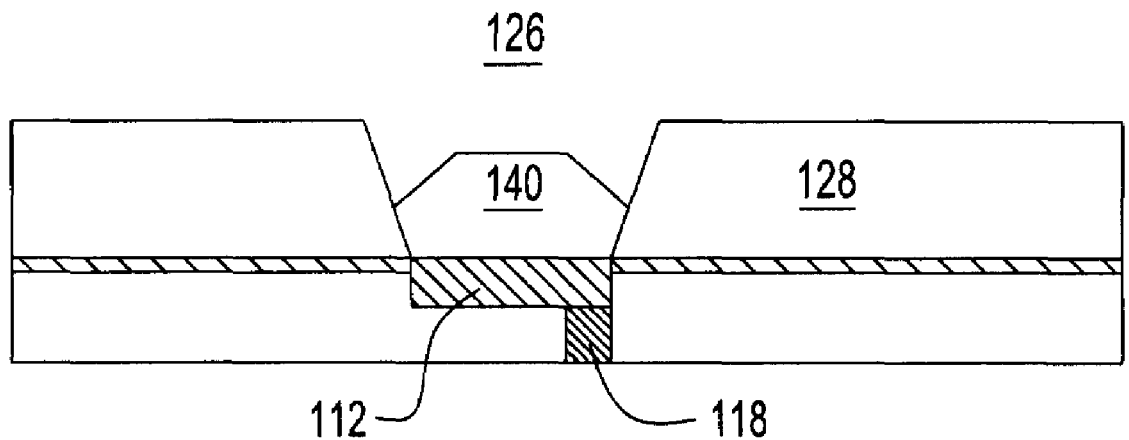
FIGS. 3A–B show plated electroplatable pads for each of the corresponding examples of FIGS. 2A–B.
Figure 3B:
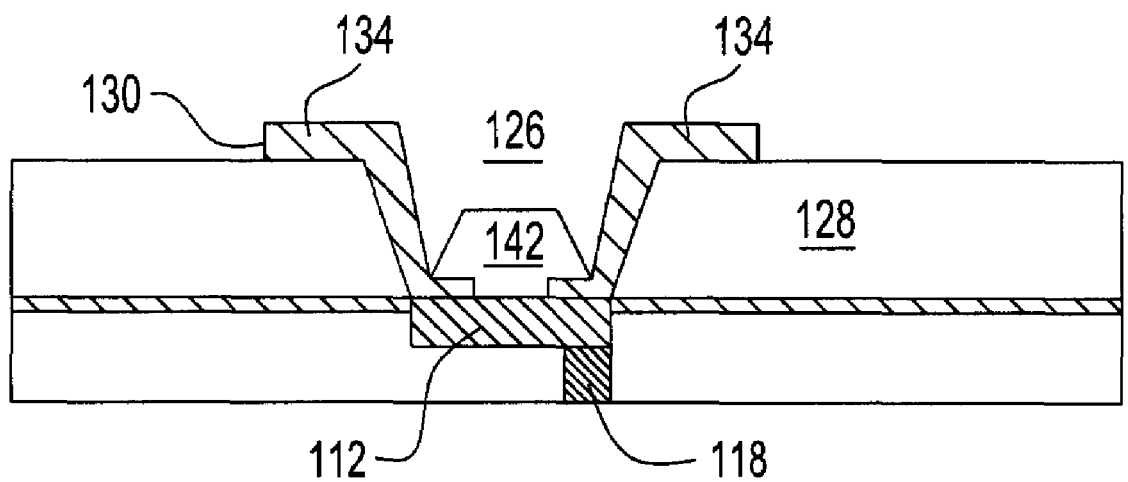

FIGS. 3A–B show electroplated pads for each of the corresponding examples of FIGS. 2A–B through area B. After forming the wafer structures 100 with electroplatable pads 112 as in FIGS. 2A or 2B, for example, a plating bias supply is applied to the conductive ring 106, which passes the plating bias current to the grid lines 108. Each grid line 108 passes the plating bias supply through the studs 122, temporary straps 114, chip wiring 120 and interlevel vias 118 to connected electroplatable pads 112, biasing each for electroplating, preferably with a noble metal, e.g., gold, platinum, palladium, rhodium, ruthenium, osmium, iridium or indium, and most preferably gold. Then, the wafer is biased at a suitable plating bias voltage and immersed in a suitable electroplating solution using a state of the art plating tool, preferably an edge sealed tool to prevent plating the conductive ring 106. During electroplating, the electroplatable pads 112 prevent the electroplating noble metal (Au) from contacting circuit wiring and the metal plating 140, 142 nucleates on electroplatable pads 112 partially or completely filling the cavities 126. Once the plated pads 140, 142 are complete, any additional attach material, such as solder balls (e.g., controlled collapsible chip connections (C4)) for flip chip bonding, may be applied to the plated pads 140, 142 or, for wire bonding, the plated pads 140, 142 remain exposed and the wafer is complete and ready for dicing. Thereafter, when the wafer is diced to separate the individual chips, the temporary plating wiring (i.e., the conductive ring 106, grid lines 108, studs 122 and portions of the temporary straps 114 encroaching farthest on the kerf 104) is removed with the kerf 104.

Figure 4:
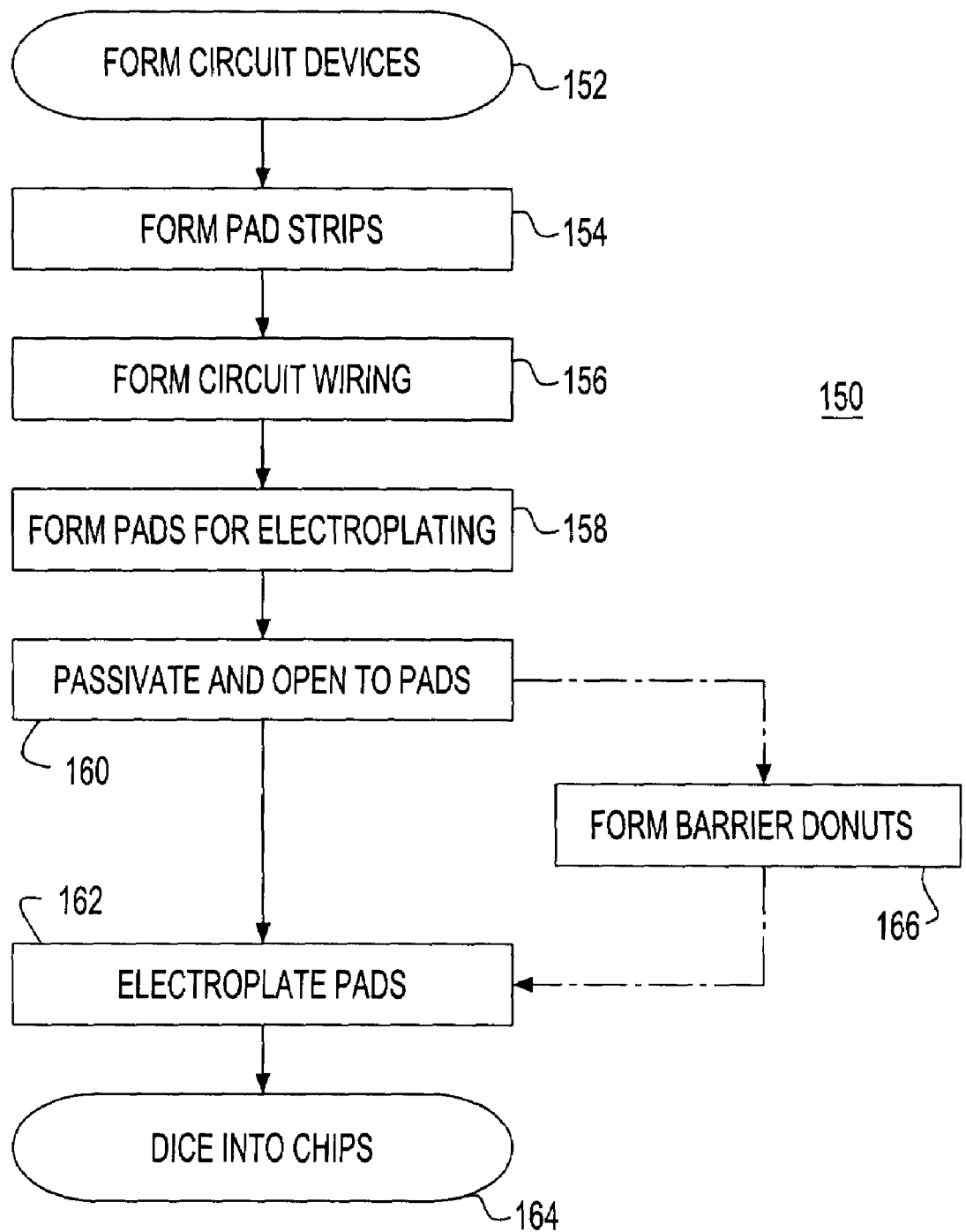
FIG. 4 shows an example of a flow diagram showing steps in forming electroplated IC chips on a wafer according to preferred embodiments of the present invention.

FIG. 4 shows a flow diagram 150 of an example for forming electroplated integrated circuit chips according to preferred embodiments of the present invention. First, in step 152 the wafer is patterned for chips to identify individual die and circuit areas and circuit devices are patterned in typical FEOL processing steps. Next in step 154, straps (e.g., 114) are formed and patterned on the FEOL wafer for strapping pads to the subsequently formed grid lines. In typical semiconductor manufacturing wiring formation step 156 (e.g., photlithographically patterning metal, forming an insulating layer and repeating) circuit wiring is formed, wiring devices together into circuits and wiring circuits together. Next, in step 158 electroplatable pads (e.g., 112) are formed in pad locations with wiring formed in step 156 connecting each pad to an underlying strap formed in step 154. It should be noted that since some pads (supply pads in particular) are connected together normally, a single strap may serve all of those wired together pads. In addition, grid lines (e.g., 108) may be formed with or subsequent to forming electroplatable pads in step 156. In step 160 a passivation layer is formed on the wafer and patterned to re-expose the electroplatable pads while leaving the grid lines protected. Next for the Example of FIG. 2A, in step 162 the pads are electroplated and in step 164 the wafer is diced into chips. For the example of FIG. 2B, barrier layer donuts (e.g., 134) are formed before electroplating in step 162 and dicing in step 164.

During dicing 164, the dicing saw cuts along the grid lines (108 in FIGS. 1 and 2A), which removes the grid lines 108, studs 122 and an underlying kerf portion of each strap 114, electrically separating each plated pad 140, 142 from other plated pads (other than pads that are intentionally connected together such as supply pads). Since the straps 114 are of a self-passivating material (e.g., tungsten), exposing the cut end of the straps to the environment at chip side walls by dicing does not introduce any effects that might be detrimental to the operation of the semiconductor device, e.g., corrosion or contamination paths.

Advantageously, the present invention allows sequentially plating different metals, e.g., alternating layers of nickel and gold, for multilevel concurrent plating. Normally, nickel oxidizes and plating gold on oxidized nickel is difficult if not impossible. The electroplated pads, which are simultaneously passivated as they are formed, have a high aspect ratio than similarly formed pads, formed using well known damascene metallization processes; and so, pads formed according to the present invention may be thicker for improved module attach, in particular for C4 or wirebond connections which also bond better to noble metals. Further, electroplating provides finer pitch control for increased line widths on narrower spaces, especially over state of the art photolithography and reactive ion etching techniques. Further, because the pads are electroplated noble metals, much smaller features can be made and used than for typical state of the art liftoff pad formation techniques. In addition, the low resistance connections facilitate forming high "Q" passive elements, especially high Q (i.e., low series resistance) inductors. Yet another advantage is the plated pads do not have the potential for undercuts encountered using RIE on TiW or in etching copper. Thus, the line width variation from undercuts is avoided/greatly reduced, thereby improving line width control and process reliability.

While the invention has been described in terms of preferred embodiments, those skilled in the art will recognize that the invention can be practiced with modification within the spirit and scope of the appended claims.

What is claimed is:

1. An integrated circuit (IC) chip with circuits formed thereon, a plurality of chip interconnect pads formed on a surface of said IC chip, one or more of said plurality of chip interconnect pads being an electroplated pad, said electroplated pad having a plated layer plated to a platable pad, said plated pad including an electrical connection to an underlying strap, said underlying strap extending horizontally from said electrical connection to a chip side wall.

2. An IC chip as in claim 1, wherein each said platable pad is disposed in a cavity in a chip surface and said plated layer is formed in said cavity.

3. An IC chip as in claim 2, wherein said plated layer is a noble metal plated layer and said noble metal is a metal selected from a group consisting of gold, platinum, palladium, rhodium, ruthenium, osmium, iridium and indium.

4. An IC chip as in claim 3, wherein said platable pad is a copper/nickel pad.

5. An IC chip as in claim 4, wherein noble metal is gold.

6. An IC chip as in claim 5, wherein each said electroplated pad includes a barrier metal layer, said barrier metal layer being a non-platable conductive material layer at the perimeter of said electroplated pad and extending upward along a sidewall of said cavity and alongside said noble metal plated layer.

7. An IC chip as in claim 6, wherein said barrier metal is a metal selected from a group consisting of nickel (Ni), tantalum (Ta), tantalum nitride (TaN), titanium (Ti), titanium nitride (TiN), aluminum (Al), tungsten (W), chromium (Cr) and titanium tungsten (TiW).

8. An IC chip as in claim 1, wherein said underlying strap extends beyond a crack stop ring.

9. An IC chip as in claim 1, wherein said underlying strap is a tungsten strap.

10. A semiconductor wafer with a plurality of die locations, each of said die locations being separated from other said die locations by a kerf space, said semiconductor wafer comprising:
    a plurality of integrated circuit (IC) chips, each IC chip including a plurality of devices formed on semiconductor surface of said semiconductor wafer in one of said die locations, said devices being wired together into a circuit, selected ones of said devices being connected to one of a plurality of chip pads;
    a conductive grid line in each said kerf space;
    a conductive ring, each said conductive grid line being connected to said conductive ring; and
    a conductive strap connected to one of said plurality of chip pads on said each chip, each of said plurality of chip pads being connected to one said conductive strap, each said conductive strap being connected to an adjacent said conductive grid line, whereby a bias supply current provided to said conductive ring, passes through to each of said plurality of chip pads on said each chip.

11. A semiconductor wafer as in claim 10, further comprising:
    a passivation layer covering said grid lines on an upper surface of said wafer, said conductive ring and at least a portion of said chip pads being exposed beneath said passivation layer.

12. A semiconductor wafer as in claim 11, further comprising:
    a pad opening in said passivation layer at each of said chip pads, said pad opening exposing a corresponding one of said chip pads through said passivation layer.

13. A semiconductor wafer as in claim 12, further comprising:
    a donut shaped barrier ring at each said pad opening, said corresponding one being exposed through the center of said donut shaped barrier ring.

14. A semiconductor wafer as in claim 12, further comprising:
    a plurality of wiring layers between said devices and said chip pads, wiring in said plurality of wiring layers connecting each of said off-chip pads to a corresponding said conductive strap.

15. A semiconductor wafer as in claim 14, wherein conductive grid lines are in a layer between said passivation layer and a pad layer, said semiconductor wafer further comprising:
    a conductive stud between each said conductive strap and said adjacent conductive grid line.

16. A semiconductor wafer as in claim 14, wherein said chip pads comprise a copper layer.

17. A semiconductor wafer as in claim 16, wherein said conductive ring and said conductive grid lines are of a conductive material selected from a group of materials consisting of nickel (Ni), Tantalum (Ta), Tantalum Nitride (TaN), Titanium (Ti), Titanium Nitride (TiN), Aluminum (Al), Tungsten (W), Chromium (Cr) and Titanium Tungsten (TiW).

18. A semiconductor wafer as in claim 16, wherein said conductive straps are tungsten straps.

19. A semiconductor wafer as in claim 16, wherein said chip pads further comprise a noble metal layer.

20. A semiconductor wafer as in claim 19, wherein said noble metal is gold.

21. A semiconductor wafer as in claim 16, further comprising:
    a crack stop ring around each of said plurality of IC chips, said crack stop ring disposed between adjacent said kerf space and an enclosed IC chip.

* * * * *